(12) United States Patent
Meixner et al.

(10) Patent No.: US 6,943,038 B2
(45) Date of Patent: Sep. 13, 2005

(54) METHOD FOR FABRICATING A FLUX CONCENTRATING SYSTEM FOR USE IN A MAGNETOELECTRONICS DEVICE

(75) Inventors: Thomas V. Meixner, Gilbert, AZ (US); Gregory W. Grynkewich, Gilbert, AZ (US); Jaynal A. Molla, Gilbert, AZ (US); J. Jack Ren, Phoenix, AZ (US); Richard G. Williams, Chandler, AZ (US); Brian R. Butcher, Gilbert, AZ (US); Mark A. Durlam, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 18 days.

(21) Appl. No.: 10/324,716

(22) Filed: Dec. 19, 2002

(65) Prior Publication Data

US 2005/0164413 A1 Jul. 28, 2005

(51) Int. Cl.⁷ .............................................. H01L 21/00
(52) U.S. Cl. ........................... 438/3; 438/692; 438/238
(58) Field of Search .............................. 438/3, 257, 258, 438/259, 695, 629, 295, 296, 210, 692, 741, 438/745, 131, 626, 631, 637, 645, 672, 737, 438/754–757, 238, 239, 241, 242, 386, 171, 438/178, 652; 257/695, 629, 295, 296

(56) References Cited

U.S. PATENT DOCUMENTS

| | | | |
|---|---|---|---|
| 3,699,619 A * | 10/1972 | Yasuda et al. ................. 29/604 |
| 5,640,343 A * | 6/1997 | Gallagher et al. ........... 365/171 |
| 5,659,499 A * | 8/1997 | Chen et al. .................. 365/158 |
| 5,702,831 A * | 12/1997 | Chen et al. .................. 428/611 |
| 5,768,181 A * | 6/1998 | Zhu et al. .................... 365/158 |
| 5,940,319 A * | 8/1999 | Durlam et al. ............... 365/171 |
| 5,946,228 A * | 8/1999 | Abraham et al. ............ 365/173 |
| 5,956,267 A * | 9/1999 | Hurst et al. .................. 365/158 |
| 6,211,090 B1 * | 4/2001 | Durlam et al. ............... 438/692 |
| 6,430,085 B1 | 8/2002 | Rizzo |
| 6,555,858 B1 * | 4/2003 | Jones et al. .................. 257/295 |
| 6,798,004 B1 * | 9/2004 | Grynkewich et al. ........ 257/295 |
| 2004/0175846 A1 * | 9/2004 | Anthony ......................... 438/3 |

OTHER PUBLICATIONS

DeBear et al., "Spin-etch Planarization for Dual Damascene Interconnect Structures," Solid State Technology, 5 pgs. (Mar. 2000).

* cited by examiner

Primary Examiner—Laura M Schillinger
(74) Attorney, Agent, or Firm—Ingrassia, Fisher & Lorenz, P.C.

(57) ABSTRACT

A method for fabricating a flux concentrating system (62) for use in a magnetoelectronics device is provided. The method comprises the steps of providing a bit line (10) formed in a substrate (12) and forming a first material layer (24) overlying the bit line (10) and the substrate (12). Etching is performed to form a trench (58) in the first material layer (24) and a cladding layer (56) is deposited in the trench (52). A buffer material layer (58) is formed overlying the cladding layer (56) and a portion of the buffer material layer (58) and a portion of the cladding layer (56) is removed.

19 Claims, 5 Drawing Sheets

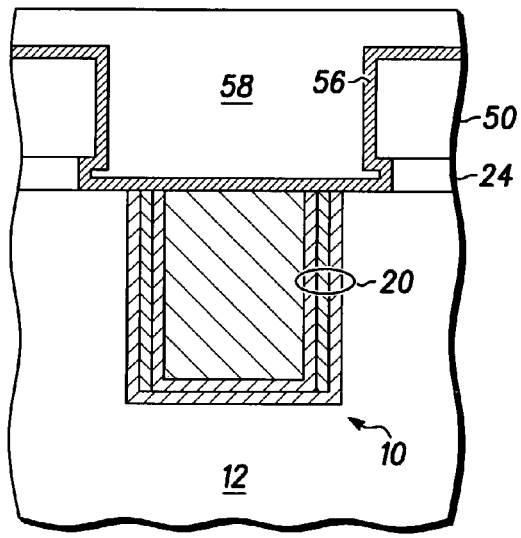
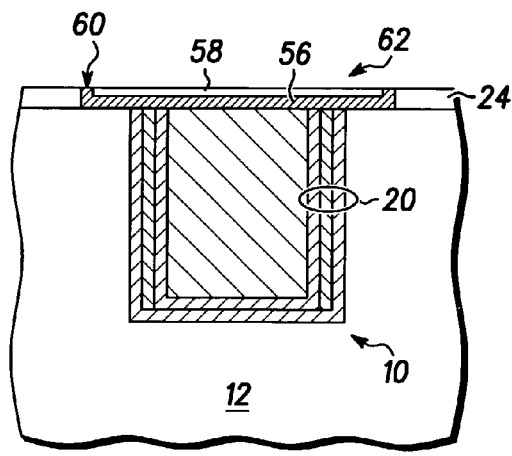
FIG. 9    FIG. 10
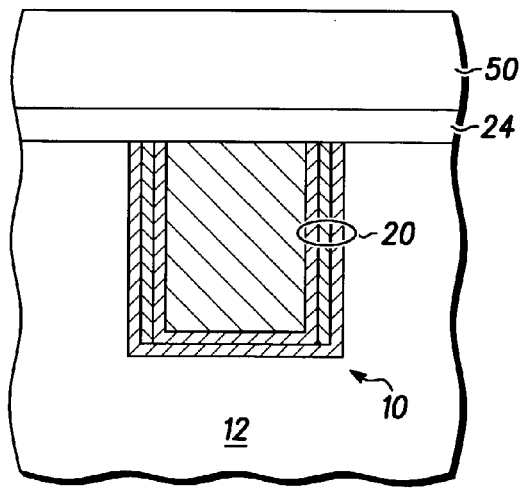
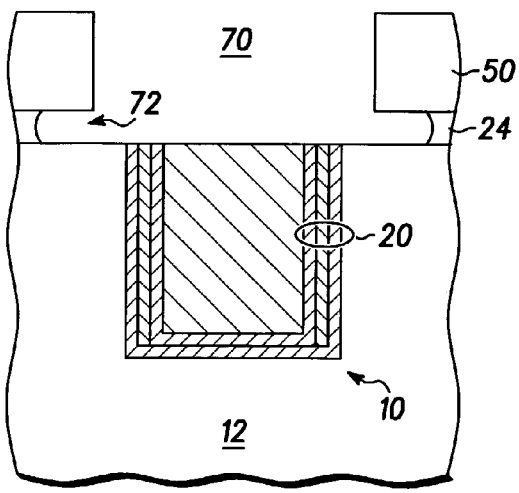
FIG. 11    FIG. 12

METHOD FOR FABRICATING A FLUX CONCENTRATING SYSTEM FOR USE IN A MAGNETOELECTRONICS DEVICE

FIELD OF INVENTION

The present invention relates generally to magnetoelectronics devices, and more particularly to a method for fabricating a flux concentrating system for use in magnetoelectronics devices.

BACKGROUND OF THE INVENTION

Magnetoelectronics devices, spin electronics devices and spintronics devices are synonymous terms for devices that use the effects predominantly caused by electron spin. Magnetoelectronics effects are used in numerous information devices, and provide non-volatile, reliable, radiation resistant, and high-density data storage and retrieval. The numerous magnetoelectronics information devices include, but are not limited to, magnetic random access memory (MRAM), magnetic sensors and read/write heads for disk drives.

Generally, a magnetoelectronics information device is constructed with an array of magnetoelectronics elements (e.g., giant magnetoresistance (GMR) elements or magnetic tunnel junction (MTJ) elements) formed in a substrate that may also include a variety of semiconductor devices, such as, for example, MOSFETs. The magnetoelectronics elements are programmed by the magnetic field created from a current-carrying conductor. Typically, two current-carrying conductors, one formed underneath the magnetoelectronics element (the digit line) and one formed overlying the magnetoelectronics element (the bit line), are arranged in cross point matrix to provide magnetic fields for programming of the magnetoelectronics element.

Advanced semiconductor processes often use metal interconnects for the current-carrying conductors. One method of forming the bit line metal interconnect is by a damascene or inlaid process during which a trench is patterned and etched in a dielectric layer, followed by the deposition of a metal layer within the trench. Flux concentrating systems often are formed proximate to the metal interconnect. Flux concentrating systems typically utilize top cladding layers formed overlying the metal interconnect to concentrate the magnetic flux of the interconnect toward the magnetoelectronics element. Such systems also typically utilize cladding layers formed on the sides of the metal interconnect to focus the magnetic flux to the underlying magnetoelectronics element. Without cladding layers, high currents are required to achieve the desired magnetic field strength. These high currents may adversely affect nearby magnetoelectronics elements not being programmed.

However, prior art methods to provide top cladding layers overlying bit lines have proved unsatisfactory. Such methods often result in roughness of the metal layer of the bit line, which may adversely affect the coercivity of the top cladding layer. Other methods may result in a "magnetic gap" between the cladding layer and the metal layer of the bit line, that is, the distance between the cladding layer and the metal layer of the bit line is sufficiently large that performance of the cladding layer is compromised. Still other methods may result in non-planar top cladding layers that exhibit detrimental magnetic interaction with pre-existing side cladding layers.

Accordingly, it is desirable to provide an improved method for fabricating a flux concentrating system for use in a magnetoelectronics device. Other desirable features and characteristics of the present invention will become apparent from the subsequent description and the appended claims, taken in conjunction with the accompanying drawings.

BRIEF DESCRIPTION OF THE DRAWINGS

The following drawings are illustrative of particular embodiments and therefore do not limit the scope of the invention, but are presented to assist in providing a proper understanding. The drawings are not to scale and are intended for use in conjunction with the explanations in the following detailed description. The present invention will hereinafter be described in conjunction with the appended drawings, wherein like reference numerals denote like elements, and:

FIGS. 6–10 illustrate schematically, in cross-section, a method for fabricating a flux concentrating system in accordance with another exemplary embodiment of the invention;

FIGS. 11–15 illustrate schematically, in cross-section, a method for fabricating a flux concentrating system in accordance with a further exemplary embodiment of the invention;

DETAILED DESCRIPTION OF THE DRAWINGS

The following detailed description is of exemplary embodiments only and is not intended to limit the invention or the application and uses of the invention. Rather, the following description provides a convenient illustration for implementing exemplary embodiments of the invention. Various changes to the described embodiments may be made in the function and arrangement of the elements described without departing from the scope of the invention as set forth in the appended claims. Furthermore, there is no intention to be bound by any theory presented in the preceding background of any exemplary embodiments of the invention.

Figure 1:
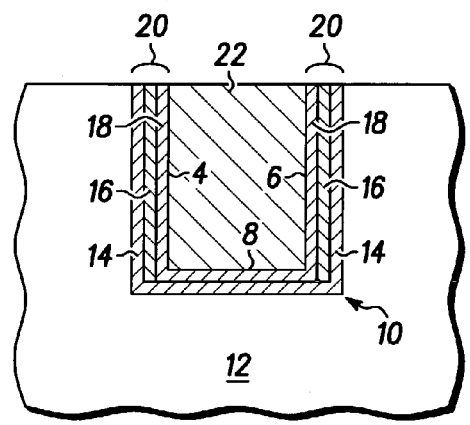
FIGS. 1–5 illustrate schematically, in cross-section, a method for fabricating a flux concentrating system in accordance with an exemplary embodiment of the invention.

Turning now to the figures, FIGS. 1–5 illustrate a method in accordance with one exemplary embodiment of the present invention for fabricating a flux concentrating system for use in a magnetoelectronics device. Referring to FIG. 1, the method may begin by providing a bit line 10, which is defined as a current-carrying conductor that is formed overlying one or more magnetoelectronic elements such that at least one of the magnetoelectronic elements is magnetically coupled to bit line 10. Bit line 10 is formed within an insulative material substrate 12, which may be any suitable insulative material such as a dielectric material formed from silicon oxide ($SiO_2$), tetraethyl orthosilicate (TEOS), silicon nitride (SiN) or other low temperature material. As used herein, "low temperature material" means any material that is formed at temperatures no higher than about 250° C. Temperatures higher than this may adversely affect the magnetic properties of the materials that comprise bit line 10. Substrate 12 may include one or more magnetoelectronics elements or may overly another substrate that includes one or more magnetoelectronics elements that are magnetically coupled to bit line 10.

Bit line 10 may be formed within insulative material substrate 12 by any suitable damascene process as is well known in the semiconductor industry. In one exemplary embodiment of the invention, bit line 10 may comprise a conducting line 22 formed of copper (Cu), aluminum (Al), gold (Au), silver (Ag) or the like, or a combined alloy thereof. Preferably, conducting line 22 is formed of copper.

In another exemplary embodiment of the invention, bit line 10 further comprises cladding layer 20 that is positioned adjacent a first surface 4 and a second surface 6, such as the sides, of conducting line 22 so that the magnetic flux from conducting line 22 may be focused to an underlying magnetoelectronics element. Cladding layer 20 may be formed using conventional methods as are well known in the semiconductor industry. In one embodiment of the invention, cladding layer 20 comprises a flux concentrating layer 16. Flux concentrating layer 16 may comprise any suitable material that has the characteristic of concentrating magnetic flux produced by the current flowing in conducting line 22. Flux concentrating layer 16 is an electrically conducting magnetic material having high permeability, such as nickel iron of any suitable proportion of nickel and iron (NiFe), or any suitable material having sufficiently high permeability to concentrate the magnetic flux in the desired area and be metallurgically compatible with the material structure. Flux concentrating layer 16 extends along surfaces 4, 6 of conducting line 22. In another embodiment of the invention, cladding layer 20 may comprise a first barrier layer 14. In a preferred embodiment, first barrier layer 14 extends along sides 4, 6 and also along a bottom surface 8 of conducting line 22 to prevent or reduce diffusion of the metal that forms conducting line 22 into substrate 12. First barrier layer 14 may comprise cobalt (Co), cobalt iron (CoFe), tantalum (Ta), tantalum nitride (TaN) or other suitable material. In a further embodiment of the invention, cladding layer 20 may comprise second barrier layer 18, which is positioned adjacent surfaces 4, 6, 8 of conducting line 22 and serves as a barrier between conducting line 22 and flux concentrating layer 16. Second barrier layer 18 may be formed of Ta, TaN, tantalum silicon nitride (TaSiN) or other similar material.

Figure 2:
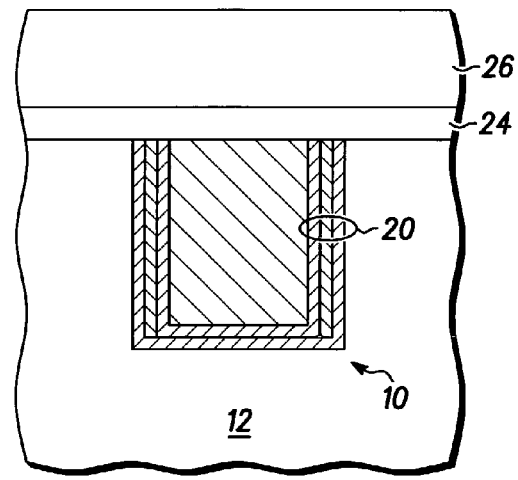

Referring to FIG. 2, a first material layer 24 is formed overlying bit line 10 and substrate 12 and a second material layer 26 is formed overlying first material layer 24. First material layer 24 and second material layer 26 may be selected such that first material layer 24 serves as an etch stop when second material layer 26 is subjected to standard etching techniques. For example, first material layer 24 may be formed of a material that is selective to a particular etch chemistry, or first material layer 24 may be formed of a material that provides an endpoint signal for stopping or slowing the etch process. Examples of low temperature materials suitable for forming first material layer 24 include, but are not limited to, plasma-enhanced nitride (PEN), TEOS, silicon nitride (SiN), aluminum nitride (AlN), silicon carbide (SiC), silicon carbon nitride (SiCN), silicon carbon oxyhydride (SiCOH), silicon oxynitride (SiON) and the like. Second material layer 26 also may be formed of these materials as long as first material layer 24 is formed of a material different from second material layer 26 and as long first material layer 24 serves as an etch stop relative to second material layer 26. In a preferred embodiment of the invention, first material layer 24 is formed from low temperature plasma-enhanced nitride and second material layer 26 is formed from TEOS.

Figure 3:
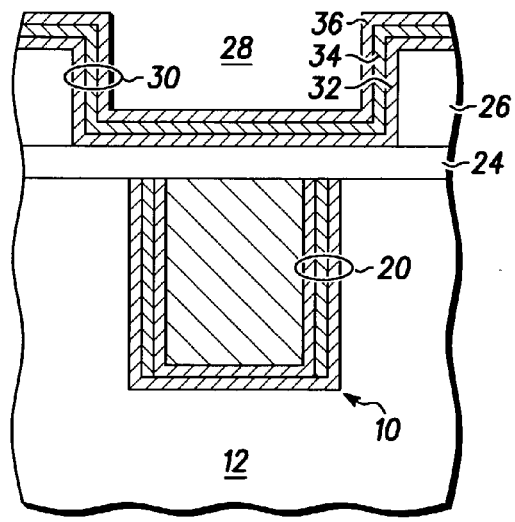

Referring to FIG. 3, a portion of second material layer 26 may be removed by patterning and etching using conventional techniques to form a trench 28 within second material layer 26. It will be appreciated that trench 28 should be at least as wide as bit line 10 to focus the magnetic flux of bit line 10 to an underlying magnetoelectronics element (not shown). Second material layer 26 may be etched utilizing any standard etching technique but is preferably etched by a dry etch in plasma. Second material layer 26 may be etched such that etching is stopped by first material layer 24, which as previously described is formed as either a layer of material that is not amenable to the etching process used to etch second material layer 26, or which indicates a change of material that stops the etching due to an endpoint detection signal.

Next, as illustrated in FIG. 3, a cladding layer 30 may be formed within trench 28. Cladding layer 30 may be formed using any suitable deposition process such as plasma vapor deposition (PVD), ion beam deposition (IBD), atomic layer deposition (ALD), electroplating or electroless plating. Cladding layer 30 may be formed of the same materials that form cladding layer 20 or may be formed of different materials. In one exemplary embodiment of the invention, cladding layer 30 comprises a flux concentrating layer 34. Flux concentrating layer 34 has the characteristic of directing magnetic flux produced by the current flowing in conducting line 22 toward a magnetoelectronics element positioned below bit line 10. Similar to flux concentrating layer 16, flux concentrating layer 34 should be an electrically conducting magnetic material having high permeability, such as nickel iron (NiFe), or any suitable material having sufficiently high permeability to concentrate the magnetic flux in the desired area and be metallurgically compatible with the material structure. In another exemplary embodiment of the invention, cladding layer 30 may also comprise a first barrier layer 32 formed underlying flux concentrating layer 34 and contacting the surfaces of trench 28, that is, overlying first and second material layers 24, 26. First barrier layer 32 acts as a diffusion barrier between the material of flux concentrating layer 34 and conducting line 22. First barrier layer 32 may comprise cobalt (Co), cobalt iron (CoFe), tantalum (Ta), tantalum nitride (TaN) or other suitable material. In a fiber exemplary embodiment of the invention, cladding layer 30 may also comprise a second barrier layer 36 that is deposited overlying flux concentrating layer 34. Second barrier layer 36 prevents or reduces diffusion of the material of flux concentrating layer 34. Second barrier layer 36 may be formed of Ta, TaN, TaSN or other similar material.

Figure 4:
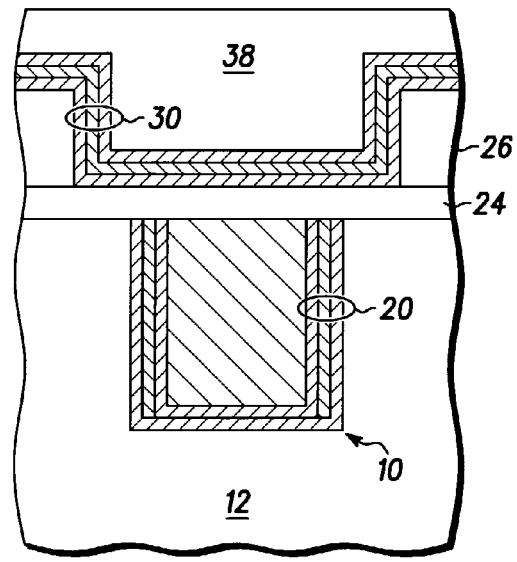

Referring to FIG. 4, a buffer material layer 38 then may be formed overlying cladding layer 30. Buffer material layer 38 may be formed of any suitable low temperature material such as PEN, TEOS, SiO$_2$, SiN, AlN, SiC, SiCN, SiCOH, SiON and the like. In a preferred embodiment of the invention, buffer material layer 38 is formed from TEOS.

Figure 5:
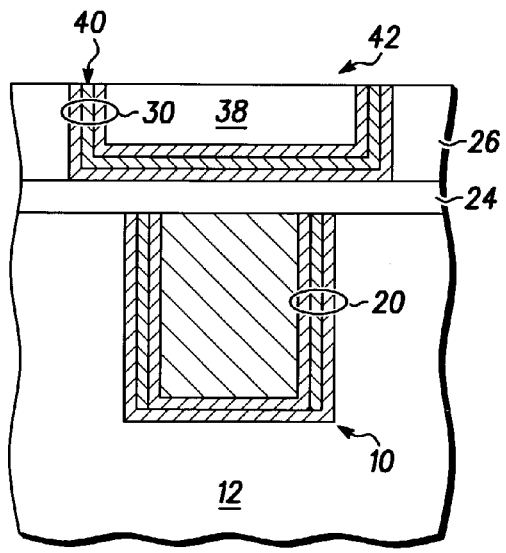
Figure 6:
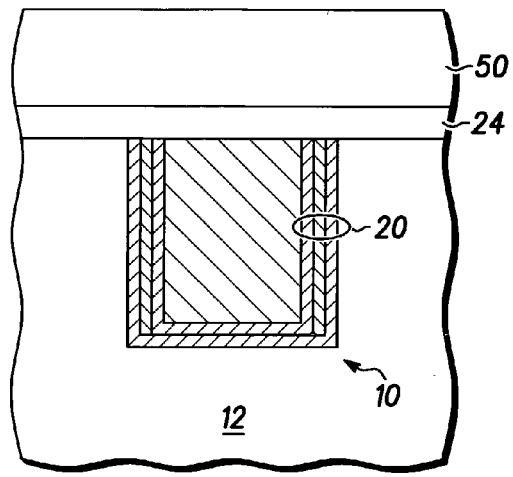

As illustrated in FIG. 5, any excess portion of cladding layer 30, such as cladding layer material formed overlying a top surface of second material layer 26, and any excess buffer material layer 38 then may be removed by any suitable planarization process known in the semiconductor industry, such as, for example, chemical mechanical planarization or electrochemical mechanical planarization, or any other suitable removal process, such as etching. Once a suitable portion of cladding layer 30 and buffer material layer 38 has been removed, a portion of cladding layer 30 remains to form a top cladding layer 40 over bit line 10. Depending on the amount of planarization performed, the top cladding layer 40 may or may not be substantially planar. Accordingly, as will be appreciated, a flux concentrating system 42 comprising top cladding layer 40 overlying first material layer 24 may be formed using the above-described exemplary embodiment of the present invention. In addition, flux concentrating system 42 may also comprise cladding layers 20 of bit line 10.

FIGS. 6–10 illustrate another exemplary embodiment of the present invention. Elements of FIGS. 6–10 that have the same reference numbers as FIGS. 1–5 are the same corresponding FIGS. 1–5 elements. The method may begin by providing bit line 10 that is formed within insulative material substrate 12. First material layer 24 is formed overlying bit line 10 and substrate 12 and a second material layer 50 is formed overlying first material layer 24. First material layer 24 and second material layer 50 may be selected such that first material layer 24 serves as an etch stop when second material layer 50 is subjected to dry plasma etching. For example, first material layer 24 may be formed of a material that is selective to dry plasma etching, or first material layer 24 may be formed of a material that provides an endpoint signal for stopping or slowing the etch process. In addition, first material layer 24 and second material layer 50 preferably are selected such that, when subjected to a particular wet etch process, the wet etch chemistry etches first material layer 24 significantly faster than second material layer 50. As used herein, to etch "significantly faster" means to etch at least about twice as fast. Thus, the wet etch chemistry etches first material layer 24 at least about twice as fast as second material layer 50. In a preferred embodiment of the invention, the wet etch chemistry etches first material layer 24 about ten times as fast as second material layer 50. Examples of low temperature materials suitable for forming first material layer 24 include, but are not limited to, plasma-enhanced nitride (PEN), TEOS, silicon nitride (SiN), aluminum nitride (AlN), silicon carbide (SiC), silicon carbon nitride (SiCN), silicon carbon oxyhydride (SiCOH), silicon oxynitride (SiON) and the like. Second material layer 50 also may be formed of these materials as long as first material layer 24 serves as an etch stop relative to second material layer 50 in dry plasma and as long as a wet etch of first material layer 24 is significantly faster than second material layer 50. In another preferred embodiment of the invention, first material layer 24 is formed from low temperature PEN and second material layer 50 is formed from TEOS.

Figure 7:
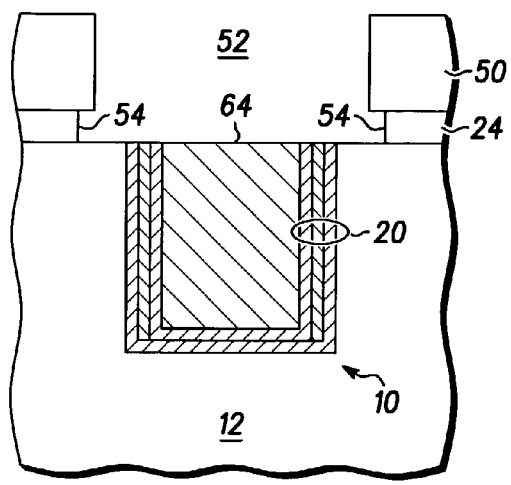

Referring to FIG. 7, a portion of second material layer 50 and first material layer 24 may be removed by patterning and etching using conventional techniques to form a trench 52 within second material layer 50 and first material layer 24. It will be appreciated that trench 50 should be at least as wide as bit line 10 so that the subsequently deposited cladding layer, as described in detail below, may focus the magnetic flux of bit line 10 to an underlying magnetoelectronics element (not shown). Second material layer 50 is preferably etched by a dry etch in plasma, as is well known in the semiconductor industry. In one exemplary embodiment of the invention, second material layer 50 may be etched such that etching is stopped by first material layer 24, which as previously described is formed as either a layer of material that is not amenable to the dry etching process, or which indicates a change of material that stops the etching due to an endpoint detection signal. In another embodiment of the invention, an etch of second material layer 50 is performed, followed by a subsequent overetch of first material layer 24, which overetch does not result in exposure of bit line 10. First material layer 24 then is etched with a wet etch chemistry that etches first material layer 24 significantly faster than second material layer 50. First material layer 24 is etched until bit line 10 is exposed or until at least a substantial amount of first material layer 24 is removed. In an optional embodiment, to ensure adequate removal of first material layer 24 from bit line 10, first material layer 24 may be overetched until trench 52 includes an undercut 54 of first material layer 24. Any suitable amount of overetch may be performed to ensure adequate removal of first material layer 24. The percentage of overetch is defined as the percentage of the time it takes to etch the thickness of first material layer 24. For example, if it takes "x" seconds to etch a layer of first material layer 24 having a thickness "y", a 100% overetch is an overetch of another x seconds or an entire etch time of 2x seconds. Similarly, a 50% overetch is an overetch of another 0.5x seconds or an entire etch time of 1.5x seconds. In one exemplary embodiment, the overetching may be about 100%. In a more preferred embodiment of the invention, the overetching may be from about 0% to about 50%.

In another exemplary embodiment of the invention, a pre-deposition sputter etch of trench 52 may be performed to remove native oxide from a surface 64 of bit line 10 and to smooth surface 64 of bit line 10. The pre-deposition sputter etch may be performed using any conventional technique known in the semiconductor industry.

Figure 8:
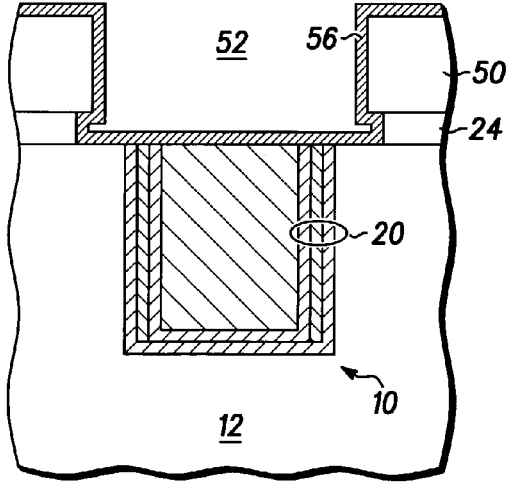

Referring to FIG. 8, a cladding layer 56 then may be formed within trench 52 using any suitable deposition process such as PVD, IBD, ALD, electroplating or electroless plating. Cladding layer 56 may be formed of all of the materials and layers that comprise cladding layer 30 as described with reference to FIG. 3.

Figure 17:
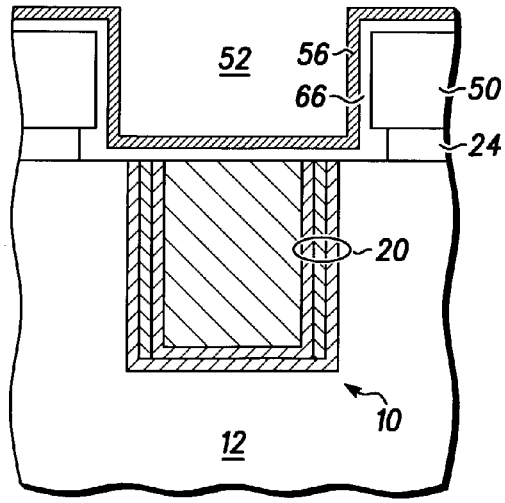
FIG. 17 illustrates schematically, in cross-section, a method for fabricating a flux concentrating system in accordance with yet another exemplary embodiment of the invention.

In an alternative embodiment of the invention, referring momentarily to FIG. 17, an insulator barrier layer 66 may be formed within trench 52 before the deposition of cladding layer 56. Insulator barrier layer 66 may be used to reduce or eliminate detrimental interaction between a subsequently formed top cladding layer, as described below, and cladding layers 20. Insulator barrier layer 66 may be formed of any suitable low temperature material, including any of those materials that may be used to form first and second material layers 24, 50. Preferably, insulator barrier layer 66 is formed of PEN.

Referring to FIG. 9, a buffer material layer 58 then may be formed within trench 52 and overlying cladding layer 56. Buffer material layer 58 may be formed of any of the materials that comprise buffer material layer 38 as described with reference to FIG. 4.

As illustrated in FIG. 10, any excess portion of cladding layer 56 and buffer material layer 58 then may be removed by any suitable planarization process known in the semiconductor industry, such as, for example, chemical mechanical planarization or electrochemical mechanical planarization, or any other suitable removal process, such as etching. Once a suitable portion of cladding layer 56 and buffer material layer 58 has been removed, a portion of cladding layer 30 remains to form a top cladding layer 60 over bit line 10. Again, depending on the amount of planarization performed, top cladding layer 60 may or may not be substantially planar. Accordingly, as will be appreciated, a flux concentrating system 62 comprising top cladding layer 60 may be formed using the above-described exemplary embodiment of the present invention. In addition to top cladding layer 60, flux concentrating system 62 may also comprise cladding layers 20 of bit line 10.

FIGS. 11–15 illustrate yet a further exemplary embodiment of the present invention. Elements of FIGS. 11–15 that have the same reference numbers as FIGS. 1–10 are the same corresponding FIGS. 1–10 elements. The method may begin by providing bit line 10 that is formed within insulative material substrate 12. First material layer 24 is formed overlying bit line 10 and substrate 12 and a second material layer 50 is formed overlying first material layer 24.

Referring to FIG. 12, a portion of second material layer 50 and first material layer 24 may be removed by patterning and etching using conventional techniques to form a trench 70 within second material layer 50 and first material layer 24. It will be appreciated that trench 70 should be at least as wide as bit line 10 so that the subsequently deposited cladding layer, as described in detail below, may focus the magnetic flux of bit line 10 to an underlying magnetoelectronics element (not shown). Second material layer 50 is preferably etched by a dry etch in plasma, as is well known in the semiconductor industry. In one embodiment of the invention, second material layer 50 may be etched such that etching is stopped by first material layer 24, which as previously described is formed as either a layer of material that is not amenable to the dry etching process, or which indicates a change of material that stops the etching due to an endpoint detection signal. In another embodiment of the invention, an etch of second material layer 50 is performed, followed by a subsequent overetch of first material layer 24, which overetch does not result in exposure of bit line 10. First material layer 24 then is etched with a wet etch chemistry that etches first material layer 24 significantly faster than second material layer 50. First material layer 24 is etched until bit line 10 is exposed and is overetched until trench 70 includes an undercut 72 of first material layer 24. In this exemplary embodiment, overetching is conducted to produce a sufficient undercut 72 so that, upon subsequent deposition of a cladding layer, as discussed below, a discontinuous cladding layer is achieved.

Figure 13:
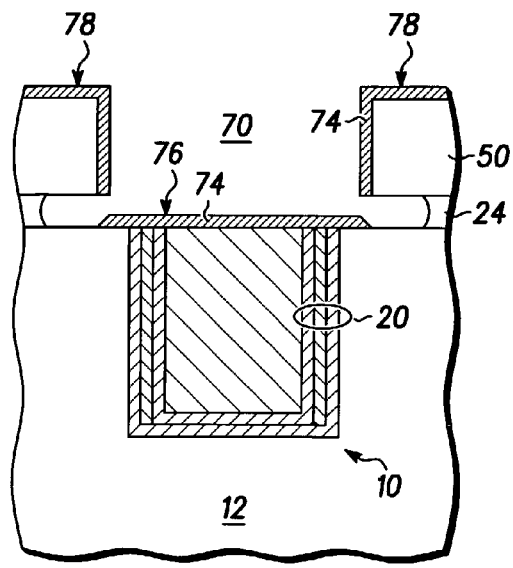

As illustrated in FIG. 13, a cladding layer 74 then may be formed within trench 70 using a deposition process such as PVD, IBD, ALD or electroless plating. Cladding layer 74 may be formed of all of the materials and layers that comprise cladding layer 30 as described with reference to FIG. 3. As described above, due at least in part to the substantial undercut 72 of first material layer 24, cladding layer 74 preferably is discontinuous, forming a top cladding layer 76 overlying bit line 10 and an ancillary cladding layer 78 overlying second material layer 50.

Figure 14:
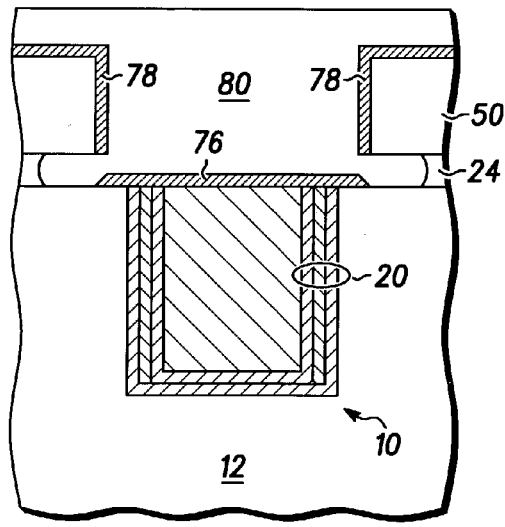

Referring to FIG. 14, a buffer material layer 80 than may be formed within trench 70 and overlying top cladding layer 76 and ancillary cladding layer 78. Buffer material layer 80 may be formed of any of the materials that comprise buffer material layer 38 as described with reference to FIG. 4.

Figure 15:
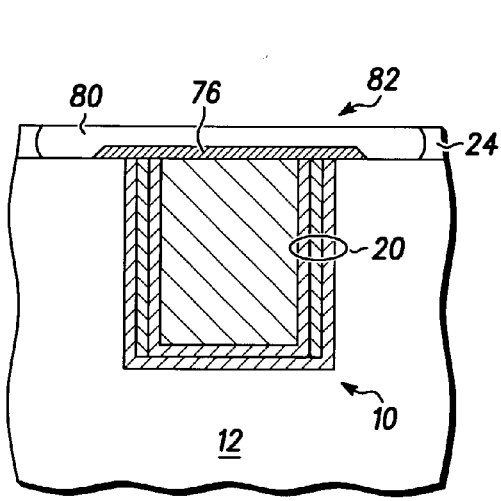

As illustrated in FIG. 15, second material layer 50 and ancillary cladding layer 78 then may be removed by any suitable planarization process known in the semiconductor industry, such as, for example, chemical mechanical planarization, electrochemical mechanical planarization, and the like. Accordingly, a flux concentrating system 82 that includes top cladding layer 76 is formed overlying bit line 10. Flux concentrating system 82 may also comprise cladding layers 20 of bit line 10.

Figure 16:
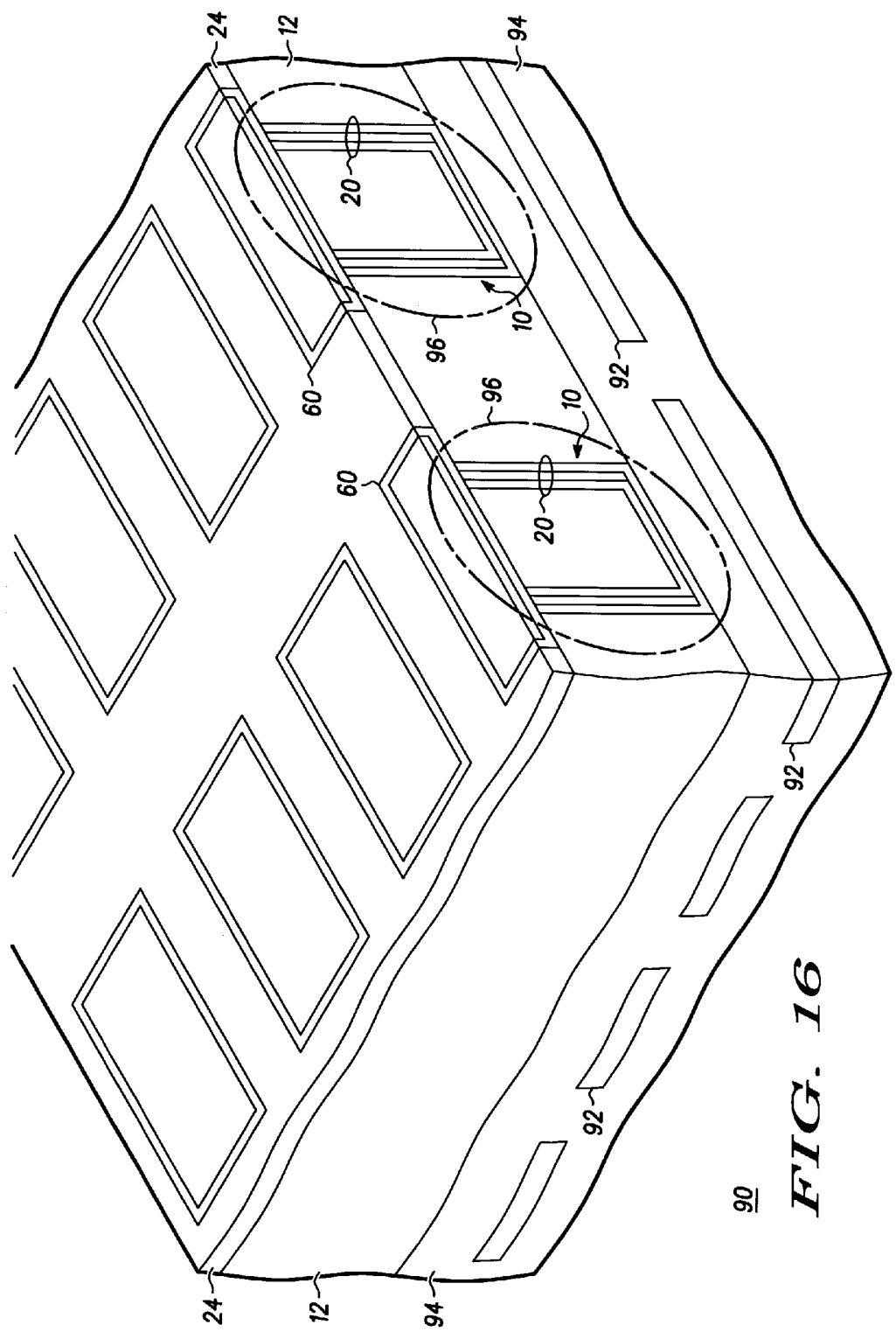
FIG. 16 is an enlarged perspective view of a portion of a random access memory device formed in accordance with an exemplary embodiment of the present invention.

FIG. 16 illustrates an enlarged perspective view of a portion of a random access memory device 90 formed in accordance with another exemplary embodiment of the present invention. Elements of FIG. 16 that have the same reference numbers as FIGS. 1–10 are the same as the corresponding FIG. 10 elements. Random access memory device 90 includes a plurality of magnetic memory units 92. Magnetic memory units 92 may be giant magnetoresistance (GMR) elements or magnetic tunnel junction (MTJ) elements. Magnetic memory units 92 may be formed on or within any suitable semiconductor substrate 94, which may include any suitable semiconductor devices (not shown), such as for example, transistors, data lines, input/output circuits, data/address decoders, and the like.

Each of magnetic memory units 92 is magnetically coupled to a bit line 10 such that a magnetic field created by bit line 10 may be used to program the plurality of magnetic memory units 92. The magnetic field created by bit line 10 may be focused toward the memory units 92 by a flux concentrating system 96. In one exemplary embodiment, as illustrated in FIG. 16, flux concentrating system 96 includes cladding layers 20 and top cladding layer 60. It will be appreciated, however, that flux concentrating system 96 may comprise any of the other exemplary embodiments of a top cladding layer described herein and may include only a top cladding layer.

Thus it is apparent that there has been provided, in accordance with the invention, a method for fabricating a flux concentrating system for use in a magnetoelectronics device. Although various embodiments of the invention have been described and illustrated with reference to specific embodiments thereof, it is not intended that the invention be limited to such illustrative embodiments. For example, it will be appreciated that, while the above-described embodiments of the method of the present invention comprise forming two layers overlying the bit line, the method also may include forming a single layer overlying the bit line, etching the single layer to form a trench and depositing a cladding layer in the trench. A buffer material layer may then be formed within the trench and overlying the cladding layer and any excess portion of the cladding layer and buffer material layer then may be removed as described above. This exemplary embodiment of the invention may result in a flux concentrating system similar to that illustrated in FIG. 10. Correspondingly, the method of the present invention may comprise forming three or more layers overlying the bit line. Additionally, the cladding layer is not limited to one flux concentrating layer but may include additional flux concentrating layers. Moreover, the cladding layer may include barrier layers in addition to the first and second barrier layers. Those of skill in the art will recognize that many variations and modifications of such embodiments are possible without departing from the spirit of the invention. Accordingly, it is intended to encompass within the invention all such modifications and variations as fall within the scope of the appended claims.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential features or elements of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for fabricating a flux concentrating system for use in a magnetoelectronics device, the method comprising the steps of:

providing a bit line formed in a substrate, wherein said bit line overlies and is magnetically coupled to a magnetoelectronic element or a magnetic memory unit;

forming a first material layer overlying said bit line and said substrate;

etching to form a trench in said first material layer, said trench disposed proximate to said bit line;

depositing a cladding layer in said trench, said cladding layer having at least one side surface and a bottom surface and configured to direct magnetic flux produced by a current flowing through said bit line;

forming a buffer material layer proximate to said at least one side surface and overlying said bottom surface of said cladding layer; and removing a portion of said buffer material layer and a portion of said cladding layer.

2. The method of claim 1, wherein the step of forming said first material layer comprises forming said first material layer from at least one of plasma-enhanced silicon nitride (PEN), tetraethylorthosilicate (TEOS), silicon nitride (SiN), aluminum nitride (AlN), silicon carbide (SiC), silicon carbon nitride (SiCN), silicon carbon oxyhydride (SiCOH) and silicon oxynitride (SiON).

3. The method of claim 1, further comprising the step of forming a second material layer overlying said bit line and said substrate before the step of forming said first material layer.

4. The method of claim 3, further comprising the step of selecting said first material layer and said second material layer such that said second material layer serves as an etch stop when said first material layer is etched.

5. The method of claim 3, wherein the step of forming said first material layer comprises forming said first material layer from at least one of plasma-enhanced silicon nitride (PEN), tetraethyl orthosilicate (TEOS), silicon nitride (SiN), aluminum nitride (AlN), silicon carbide (SiC), silicon carbon nitride (SiCN), silicon carbon oxyhydride (SiCOH) and silicon oxynitride (SiON).

6. The method of claim 3, wherein the step of forming said second material layer comprises forming said second material layer from at least one of plasma-enhanced silicon nitride (PEN), tetraethyl orthosilicate (TEOS), silicon nitride (SiN), aluminum nitride (AlN), silicon carbide (SiC), silicon carbon nitride (SiCN), silicon carbon oxyhydride (SiCOH) and silicon oxynitride (SiON).

7. The method of claim 3, wherein the step of forming said second material layer comprises forming said second material layer of plasma-enhanced nitride and the step of forming said first material layer comprises forming said first material layer from tetraethyl orthosilicate.

8. The method of claim 1, the step of etching comprising etching by dry plasma etching.

9. The method of claim 3, the step of etching comprising etching by dry plasma etching.

10. The method of claim 1, the step of depositing a cladding layer comprising depositing a flux concentrating layer that is an electrically conducting magnetic material having sufficiently high permeability to concentrate magnetic flux to a desired area.

11. The method of claim 10, the step of depositing a cladding layer comprising depositing a flux concentrating layer formed of nickel iron (NiFe).

12. The method of claim 1, the step of removing a portion of said buffer material layer and a portion of said cladding layer comprising removing by chemical mechanical planarization.

13. The method of claim 3, wherein the step of etching comprises etching said first material layer with a dry plasma etch and etching said first and second material layers using a wet etch chemistry that causes said second material layer to etch significantly faster than said first material layer, said etching forming a trench in said first and second material layers.

14. The method of claim 13, wherein the step of forming said second material layer comprises forming said second material layer of plasma-enhanced nitride and the step of forming said first material layer comprises forming said first material layer from tetraethyl orthosilicate.

15. The method of claim 13, wherein the step of depositing a cladding layer within said trench comprises depositing a discontinuous cladding layer.

16. The method of claim 13, wherein the step of etching further comprises an overetching of said second material layer of about 100%.

17. The method of claim 13, wherein the step of etching further comprises an overetching of said second material layer of about 0%–50%.

18. The method of claim 1, wherein the step of providing a bit line comprises providing a bit line comprising a conducting line having a first surface and a second surface and a cladding layer that is positioned adjacent said first and second surfaces of said conducting line.

19. The method of claim 13, further comprising the step of forming an insulator barrier layer in said trench before the step of depositing a cladding layer.

* * * * *